(12) United States Patent
Kang

(10) Patent No.: US 11,863,139 B2
(45) Date of Patent: *Jan. 2, 2024

(54) AMPLIFIER AND RECEIVING CIRCUIT, SEMICONDUCTOR APPARATUS, AND SEMICONDUCTOR SYSTEM USING THE SAME

(71) Applicant: SK hynix Inc., Icheon-si Gyeonggi-do (KR)

(72) Inventor: Ji Hyo Kang, Seongnam-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 9 days.

This patent is subject to a terminal disclaimer.

(21) Appl. No.: 17/544,478

(22) Filed: Dec. 7, 2021

(65) Prior Publication Data

US 2022/0094314 A1 Mar. 24, 2022

Related U.S. Application Data

(63) Continuation of application No. 16/560,700, filed on Sep. 4, 2019, now Pat. No. 11,233,489.

(30) Foreign Application Priority Data

Feb. 18, 2019 (KR) .................. 10-2019-0018496

(51) Int. Cl.
*H03F 3/45* (2006.01)
*H03G 3/30* (2006.01)
(Continued)

(52) U.S. Cl.
CPC ......... *H03F 3/4521* (2013.01); *H03G 1/0029* (2013.01); *H03G 3/30* (2013.01);
(Continued)

(58) Field of Classification Search
CPC ......... H03F 3/4521; H03F 2203/45022; H03F 3/45183; H03F 1/14; H03F 3/4508;
(Continued)

(56) References Cited

U.S. PATENT DOCUMENTS 7,701,258 B2 4/2010 Chiu et al.
8,200,179 B1 6/2012 Mosinskis et al.
(Continued)

FOREIGN PATENT DOCUMENTS

CN 104956599 A 9/2015
CN 106953609 A 7/2017
(Continued)

OTHER PUBLICATIONS

Umut Yilmazer et al., Design and comparison of high bandwidth limiting amplifier topologies, 2015 9th International Conference on Electrical and Electronics Engineering (ELECO), Nov. 26-28, 2015, pp. 66-70, IEEE, Bursa, Turkey.

(Continued)

*Primary Examiner* — Andrea Lindgren Baltzell
*Assistant Examiner* — Khiem D Nguyen
(74) *Attorney, Agent, or Firm* — William Park & Associates Ltd.

(57) ABSTRACT

An amplifier includes an amplification circuit, an equalization circuit, an output circuit, a first gain adjusting circuit, and a second gain adjusting circuit. The amplification circuit changes voltage levels of first and second amplification nodes based on first and second input signals. The equalization circuit changes the voltage levels of the first and second amplification nodes. The output circuit generates an output signal based on the voltage levels of the first and second amplification nodes. The first gain adjusting circuit changes voltage levels applied to the first and second amplification nodes based on the voltage levels of the first (Continued)

and second amplification nodes and a first gain control signal. The second gain adjusting circuit changes a voltage level of the output signal based on a second gain control signal.

9 Claims, 10 Drawing Sheets

(51) Int. Cl.
*H03G 1/00* (2006.01)
*H04L 25/03* (2006.01)
(52) U.S. Cl.
CPC ............. *H03F 2203/45022* (2013.01); *H04L 25/03057* (2013.01)
(58) Field of Classification Search
CPC ...... H03G 1/0029; H03G 3/30; H03G 1/0088; H03G 5/28; H03G 3/3036; H04L 25/03057; H04L 25/085

USPC .......................................... 330/278, 253, 254
See application file for complete search history.

(56) References Cited

U.S. PATENT DOCUMENTS

| | | |
|---|---|---|
| 9,614,564 B2 | 4/2017 | Chang et al. |
| 2017/0085239 A1 | 3/2017 | Yuan et al. |

FOREIGN PATENT DOCUMENTS

| | | |
|---|---|---|
| CN | 108023553 A | 5/2018 |
| CN | 108075739 A | 5/2018 |

OTHER PUBLICATIONS

Hao Zhangwei, Research and Design of a Ultra-wideband Low Noise Amplifier and a Mixer in SiGe BiCMOS, May 2017, pp. 1-81, China Academic Journal Electronic Publishing House.

AMPLIFIER AND RECEIVING CIRCUIT, SEMICONDUCTOR APPARATUS, AND SEMICONDUCTOR SYSTEM USING THE SAME

CROSS-REFERENCES TO RELATED APPLICATION

The present application is a continuation application of U.S. patent application Ser. No. 16/560,700, filed on Sep. 4, 2019, and claims priority under 35 U.S.C. § 119(a) to Korean application number 10-2019-0018496, filed on Feb. 18, 2019, in the Korean Intellectual Property Office, which is incorporated herein by reference in its entirety.

BACKGROUND

1. Technical Field

Various embodiments generally relate to integrated circuit technology, and more particularly, to a semiconductor apparatus and a semiconductor system.

2. Related Art

An electronic device may include many electronic components. For example, a computer system may include a large number of semiconductor apparatuses composed of semiconductors. The semiconductor apparatuses constituting the computer system may communicate with each other while transmitting and receiving clocks and data. Each of the semiconductor apparatuses may include a receiving circuit to receive a signal transmitted from an external device or receive a signal transmitted between internal circuits in the semiconductor apparatus. The receiving circuit may include an amplification circuit to perform a differential amplification operation. The amplification circuit may receive differential signals or a single-ended signal. The amplification circuit uses a reference voltage to receive a single-ended signal. When the amplification circuit receives differential signals, one input signal has a complementary level to the other input signal. Thus, the amplification circuit may compensate for inter-symbol interference (ISI) caused by a high-frequency loss, reflection, and cross-talk of a channel and increase an AC gain, in order to accurately amplify the signals. However, when the amplification circuit receives the single-ended signal, the voltage level of the single-ended signal as one input signal swings, but the reference voltage as the other input signal retains a predetermined voltage level. Therefore, the common mode of the amplification circuit may drift, or the AC gain may decrease.

SUMMARY

In an embodiment, an amplifier may include an amplification circuit, a first gain adjusting circuit, an equalization circuit, an output circuit, and a second gain adjusting circuit. The amplification circuit may be configured to change voltage levels of a first amplification node and a second amplification node based on a first input signal and a second input signal. The first gain adjusting circuit may be configured to change voltage levels applied to the first and second amplification nodes based on the voltage levels of the first and second amplification nodes and a first gain control signal. The equalization circuit may be configured to change the voltage level of the second amplification node based on the voltage level of the first amplification node and configured to change the voltage level of the first amplification node based on the voltage level of the second amplification node. The output circuit may be configured to generate an output signal based on the voltage levels of the first and second amplification nodes. The second gain adjusting circuit may be configured to change a voltage level of the output signal based on a second gain control signal.

In an embodiment, an amplifier may include an amplification circuit, a first gain adjusting circuit, an equalization circuit, a second gain adjusting circuit, and a third gain adjusting circuit. The amplification circuit may be configured to change voltage levels of a first amplification node and a second amplification node based on a first input signal and a second input signal. The first gain adjusting circuit may be configured to change voltage levels applied to the first and second amplification nodes based on the voltage levels of the first and second amplification nodes and a first gain control signal. The equalization circuit may be configured to couple a first equalization node to the second amplification node based on the voltage level of the first amplification node and configured to couple a second equalization node to the first amplification node based on the voltage level of the second amplification node. The second gain adjusting circuit may be configured to couple the first and second equalization nodes based on a second gain control signal. The third gain adjusting circuit may be configured to change the amounts of current flowing through the first and second equalization nodes based on a third gain control signal.

DETAILED DESCRIPTION

Figure 1:
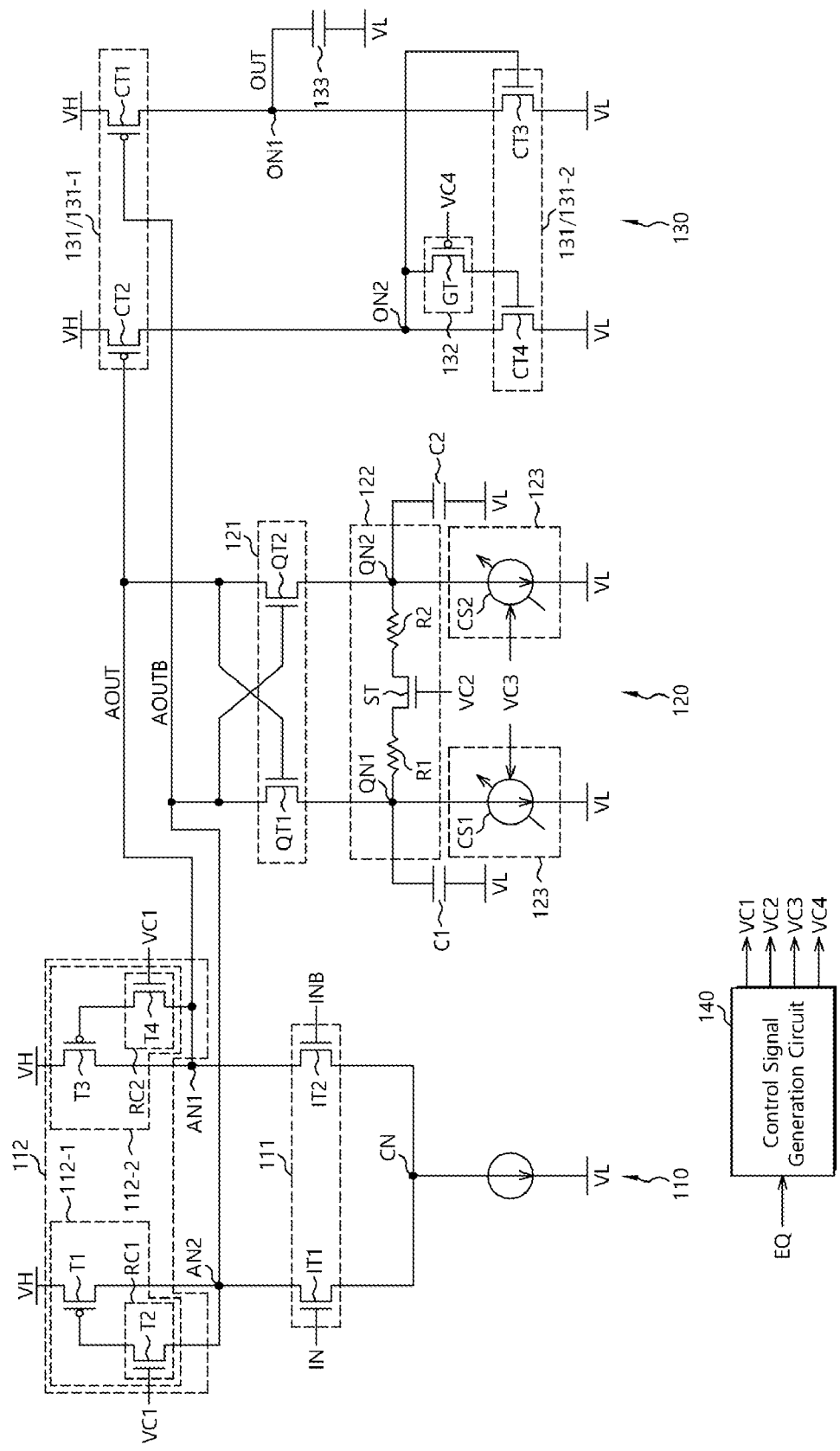
FIG. 1 is a diagram illustrating a configuration of an amplifier in accordance with an embodiment.

FIG. 1 is a diagram illustrating a configuration of an amplifier 100 in accordance with an embodiment. The amplifier 100 may receive input signals and generate an output signal by amplifying the input signals. The amplifier 100 may receive a first input signal IN and a second input signal INB. The amplifier 100 may generate an output signal OUT by differentially amplifying the first and second input signals IN and INB. In an embodiment, the first and second input signals IN and INB may be differential signals, and the second input signal INB may have a complementary voltage level to the first input signal IN. In an embodiment, the first input signal IN may be a single-ended signal. When the first input signal IN is a single-ended signal, the second input signal INB may serve as a reference voltage. The reference voltage may have a voltage level corresponding to the middle level of the range in which the first input signal IN swings. The amplifier 100 may include one or more gain adjusting circuits. The one or more gain adjusting circuits may adjust gains of the amplifier 100. The gains of the amplifier 100 may include a DC gain and/or an AC gain The DC gain, which is a gain of the amplifier when an input signal having a relatively low frequency is received, may indicate a gain of the amplifier 100 when the first input signal IN retains a steady-state voltage level. The AC gain, which is a gain of the amplifier when an input signal having a relatively high frequency is received, may indicate a gain of the amplifier 100 when the voltage level of the first input signal IN transitions. The amplifier 100 may include one or more gain adjusting circuits to adjust the DC gain and the AC gain in various manners.

In FIG. 1, the amplifier 100 may include an amplification stage 110, an equalization stage 120, and an output stage 130. The amplification stage 110 may receive the first and second input signals IN and INB, and generate a first amplified signal AOUT and a second amplified signal AOUTB by differentially amplifying the first and second input signals IN and INB. The amplification stage 110 may generate the first and second amplified signals AOUT and AOUTB by changing the voltage levels of first and second amplification nodes AN1 and AN2 based on the first and second input signals IN and INB. The equalization stage 120 may be coupled to the first and second amplification nodes AN1 and AN2, and change the voltage levels of the first and second amplified signals AOUT and AOUTB by equalizing the voltage levels of the first and second amplification nodes AN1 and AN2. The equalization stage 120 may change the voltage level of the second amplification node AN2 based on the voltage level of the first amplification node AN1, and change the voltage level of the first amplification node AN1 based on the voltage level of the second amplification node AN2. The output stage 130 may be coupled to the first and second amplification nodes AN1 and AN2, and receive the first and second amplified signals AOUT and AOUTB. The output stage 130 may generate the output signal OUT based on the first and second amplified signals AOUT and AOUTB. Each of the amplification stage 110, the equalization stage 120, and the output stage 130 may include one or more gain adjusting circuits to adjust the gain of the amplifier.

The amplification stage 110 may be coupled between a first supply voltage VH terminal and a second supply voltage VL terminal, and perform an amplification operation on the first and second input signals IN and INB. The amplification stage 110 may include an amplification circuit 111 and a first gain adjusting circuit 112. The amplification circuit 111 may receive the first and second input signals IN and INB, and change the voltage levels of the first and second amplification nodes AN1 and AN2 based on the first and second input signals IN and INB. The amplification circuit 111 may change the voltage levels of the first and second amplification nodes AN1 and AN2 by differentially amplifying the first and second input signals IN and INB. The amplification circuit 111 may change the voltage level of the second amplification node AN2 based on the first input signal IN, and change the voltage level of the first amplification node AN1 based on the second input signal INB. The first gain adjusting circuit 112 may be coupled to the first and second amplification nodes AN1 and AN2. The first gain adjusting circuit 112 may receive a first gain control signal VC1. The first gain adjusting circuit 112 may change voltage levels applied to the first and second amplification nodes AN1 and AN2 based on the voltage levels of the first and second amplification nodes AN1 and AN2 and the first gain control signal VC1. The first gain adjusting circuit 112 may increase the AC gain of the amplifier 100 by forming inductive peaks of the first and second amplified signals AOUT and AOUTB based on the first gain control signal VC1. The first gain adjusting circuit 112 may have a structure of an active inductor to adjust the AC gain of the amplifier 100.

The amplification circuit 111 may include a first input transistor IT1 and a second input transistor IT2. The first and second input transistors IT1 and IT2 may be N-channel MOS transistors. The first input transistor IT1 may have a gate configured to receive the first input signal IN, a drain coupled to the second amplification node AN2, and a source coupled to a common node CN. The second input transistor IT2 may have a gate configured to receive the second input signal INB, a drain coupled to the first amplification node AN1, and a source coupled to the common node CN. The common node CN may be coupled to the second supply voltage VL terminal. The common node CN may be coupled to the second supply voltage VL terminal through a current source. When the first input signal IN is at a logic high level, the first input transistor IT1 may lower the voltage level of the second amplification node AN2 to a lower level than the voltage level of the first amplification node AN1. Therefore, the second amplified signal AOUTB having a logic low level may be outputted through the second amplification node AN2, and the first amplified signal AOUT having a logic high level may be outputted through the first amplification node AN1. On the other hand, when the first input signal IN is at a logic low level, the first input transistor IT1 may raise the voltage level of the second amplification node AN2 to a higher level than the voltage level of the first amplification node AN1. Therefore, the second amplified signal AOUTB having a logic high level may be outputted through the second amplification node AN2, and the first amplified signal AOUT having a logic low level may be outputted through the first amplification node AN1.

The first gain adjusting circuit 112 may include a first active inductor 112-1 and a second active inductor 112-2. The first active inductor 112-1 may be coupled between the first supply voltage VH terminal and the second amplification node AN2, and apply the first supply voltage VH to the second amplification node AN2 based on the first gain control signal VC1. The first active inductor 112-1 may change a voltage level applied to the second amplification node AN2 based on the first gain control signal VC1. The second active inductor 112-2 may be coupled between the first supply voltage VH terminal and the first amplification node AN1, and apply the first supply voltage VH to the first amplification node AN1 based on the first gain control signal VC1. The second active inductor 112-2 may change a voltage level applied to the first amplification node AN1 based on the first gain control signal VC1.

The first active inductor 112-1 may include a first transistor T1 and a first resistor circuit RC1. The first transistor T1 may be a P-channel MOS transistor. The first transistor T1 may have a source coupled to the first supply voltage VH terminal and a drain coupled to the second amplification node AN2. The first resistor circuit RC1 may be coupled between a gate of the first transistor T1 and the second amplification node AN2. The first resistor circuit RC1 may have a resistance value that is varied based on the first gain control signal VC1. The first resistor circuit RC1 may include a second transistor T2. The second transistor T2 may be an N-channel MOS transistor. The second transistor T2 may have a gate configured to receive the first gain control signal VC1, and a drain and source of which one is coupled to the gate of the first transistor T1 and the other is coupled to the second amplification node AN2. The first transistor T1 may adjust the level of a voltage applied to the second amplification node AN2 from the first supply voltage VH terminal based on the voltage level of the second amplification node AN2. The second transistor T2 may have a resistance value that is varied based on the first gain control signal VC1. Therefore, the second transistor T2 may adjust the level of a voltage which the first transistor T1 applies to the second amplification node AN2, according to the first gain control signal VC1.

The second active inductor 112-2 may include a third transistor T3 and a second resistor circuit RC2. The third transistor T3 may be a P-channel MOS transistor. The third transistor T3 may have a source coupled to the first supply voltage VH terminal and a drain coupled to the first amplification node AN1. The second resistor circuit RC2 may be coupled between a gate of the third transistor T3 and the first amplification node AN1. The second resistor circuit RC2 may have a resistance value that is varied based on the first gain control signal VC1. The second resistor circuit RC2 may include a fourth transistor T4. The fourth transistor T4 may be an N-channel MOS transistor. The fourth transistor T4 may have a gate configured to receive the first gain control signal VC1 and a drain and source of which one is coupled to the gate of the second transistor T2 and the other is coupled to the first amplification node AN1. The third transistor T3 may adjust the level of a voltage applied to the first amplification node AN1 from the first supply voltage VH terminal based on the voltage level of the first amplification node AN1. The fourth transistor T4 may have a resistance value that is varied based on the first gain control signal VC1. Therefore, the fourth transistor T4 may adjust the level of a voltage which the third transistor T3 applies to the first amplification node AN1, according to the first gain control signal VC1.

The equalization stage 120 may include an equalization circuit 121, a second gain adjusting circuit 122, and a third gain adjusting circuit 123. The second and third gain adjusting circuits 122 and 123 may be included as components of the equalization circuit 121. The equalization circuit 121 may be coupled between the first and second amplification nodes AN1 and AN2 and the second supply voltage VL terminal, and perform an equalization operation on the first and second amplified signals AOUT and AOUTB. The equalization circuit 121 may include a first equalization transistor QT1 and a second equalization transistor QT2. The first and second equalization transistors QT1 and QT2 may be N-channel MOS transistors. The first equalization transistor QT1 may have a gate coupled to the first amplification node AN1, a drain coupled to the second amplification node AN2, and a source coupled to a first equalization node QN1. The first equalization transistor QT1 may couple the second amplification node AN2 to the first equalization node QN1, based on the voltage level of the first amplification node AN1. The second equalization transistor QT2 may have a gate coupled to the second amplification node AN2, a drain coupled to the first amplification node AN1, and a source coupled to a second equalization node QN2. The second equalization transistor QT2 may couple the first amplification node AN1 to the second equalization node QN2, based on the voltage level of the second amplification node AN2.

The second gain adjusting circuit 122 may receive a second gain control signal VC2, and adjust the gain of the amplifier 100 based on the second gain control signal VC2. The second gain adjusting circuit 122 may couple the first equalization node QN1 and the second equalization node QN2, based on the second gain control signal VC2. The second gain adjusting circuit 122 may include a first resistor R1, a second resistor R2, and a source transistor ST. The first resistor R1 may have one end coupled to the first equalization node QN1. The second resistor R2 may have one end coupled to the second equalization node QN2. The source transistor ST may be coupled between the other ends of the first and second resistors R1 and R2. The source transistor ST may couple the other ends of the first and second resistors R1 and R2 based on the second gain control signal VC2. The source transistor ST may have a resistance value that is set based on the second gain control signal VC2. The source transistor ST may be an N-channel MOS transistor. The source transistor ST may have a gate configured to receive the second gain control signal VC2 and a drain and source of which one is coupled to the other end of the first resistor R1 and the other is coupled to the other end of the second resistor R2. The second gain adjusting circuit 122 may adjust the DC gain and/or the entire gain of the amplifier 100.

The third gain adjusting circuit 123 may adjust the amount of current flowing through the first and second equalization nodes QN1 and QN2, based on a third gain control signal VC3. The third gain adjusting circuit 123 may include a first current source CS1 and a second current source CS2. The first and second current is sources CS1 and CS2 may be variable current sources whose current amounts are adjusted by the third gain control signal VC3. The first current source CS1 may be coupled between the first equalization node QN1 and the second supply voltage VL terminal. The first current source CS1 may adjust the amount of current flowing from the first equalization node QN1 to the second supply voltage VL terminal, based on the third gain control signal VC3. The second current source CS2 may be coupled between the second equalization node QN2 and the second supply voltage VL terminal. The second current source CS2 may adjust the amount of current flowing from the second equalization node QN2 to the second supply voltage VL terminal, based on the third gain control signal VC3.

The equalization stage 120 may further include a first capacitor C1 and a second capacitor C2. The first capacitor C1 may have one end coupled to the first equalization node QN1 and the other end coupled to the second supply voltage VL terminal. The second capacitor C2 may have one end coupled to the second equalization node QN2 and the other end coupled to the second supply voltage VL terminal. The first and second capacitors C1 and C2 may change the AC gain of the amplifier 100. The first and second capacitors C1 and C2 may have the same capacitance or different capacitances. In an embodiment, the first and second capacitors C1 and C2 may have a variable capacitance to adjust the AC gain of the amplifier.

The output stage 130 may include an output circuit 131 and a fourth gain adjusting circuit 132. The output circuit 131 may be coupled to the first and second amplification nodes AN1 and AN2, and receive the first and second amplified signals AOUT and AOUTB. The output circuit 131 may generate the output signal OUT based on the first and second amplified signals AOUT and AOUTB. The fourth gain adjusting circuit 132 may receive a fourth gain control signal VC4, and adjust the gain of the amplifier 100 based on the fourth gain control signal VC4. The fourth gain adjusting circuit 132 may change the voltage level of the output signal OUT based on the fourth gain control signal VC4. The fourth gain adjusting circuit 132 may change the AC gain of the amplifier 100 by changing the voltage level of the output signal OUT.

The output circuit 131 may include a current supply circuit 131-1 and a current discharge circuit 131-2. The current supply circuit 131-1 may be coupled between the first supply voltage VH terminal and first and second output nodes ON1 and ON2. The current supply circuit 131-1 may supply a current to the first and second output nodes ON1 and ON2 based on the first and second amplified signals AOUT and AOUTB. The current supply circuit 131-1 may supply a current to the second output node ON2 based on the first amplified signal AOUT, and supply a current to the first output node ON1 based on the second amplified signal AOUTB. The current supply circuit 131-1 may change the voltage level of the second output node ON2 based on the voltage level of the first amplification node AN1, and change the voltage level of the first output node ON1 based on the voltage level of the second amplification node AN2.

The current discharge circuit 131-2 may be coupled between the first and second output nodes ON1 and ON2 and the second supply voltage VL terminal. The current discharge circuit 131-2 may change the voltage level of the first output node ON1 based on the voltage level of the second output node ON2. The current discharge circuit 131-2 may adjust the amounts of current flowing from the first and second output nodes ON1 and ON2 to the second supply voltage VL terminal, based on the voltage level of the second output node ON2.

The current supply circuit 131-1 may include a first current transistor CT1 and a second current transistor CT2. The first and second current transistors CT1 and CT2 may be P-channel MOS transistors. The first current transistor CT1 may have a gate coupled to the second amplification node AN2 to receive the second amplified signal AOUTB. The first current transistor CT1 may have a source coupled to the first supply voltage VH terminal and a drain coupled to the first output node ON1. The second current transistor CT2 may have a gate coupled to the first amplification node AN1 to receive the first amplified signal AOUT. The second current transistor CT2 may have a source coupled to the first supply voltage VH terminal and a drain coupled to the second output node ON2.

The current discharge circuit 131-2 may include a third current transistor CT3 and a fourth current transistor CT4. The third and fourth current transistors CT3 and CT4 may be N-channel MOS transistors. The third current transistor CT3 may have a gate coupled to the second output node ON2, a drain coupled to the first output node ON1, and a source coupled to the second supply voltage VL terminal. The fourth current transistor CT4 may have a gate coupled to the second output node ON2, a drain coupled to the second output node ON2, and a source coupled to the second supply voltage VL terminal.

The fourth gain adjusting circuit 132 may include a gain transistor GT. The gain transistor GT may be a P-channel MOS transistor. The gain transistor GT may have a gate configured to receive the fourth gain control signal VC4, a source coupled to the second output node ON2, and a drain coupled to the gate of the fourth current transistor CT4. The gain transistor GT may change the amount of current supplied to the gate of the fourth current transistor CT4 from the second output node ON2, based on the fourth gain control signal VC4.

The output stage 130 may further include an output capacitor 133. The output capacitor 133 may have one end coupled to the first output node ON1 and the other end coupled to the second supply voltage VL terminal. The output capacitor 133 may stabilize the voltage level of the first output node ON1, thereby stably retaining the voltage level of the output signal OUT.

The amplifier 100 may further include a control signal generation circuit 140. The control signal generation circuit 140 may generate the first gain control signal VC1, the second gain control signal VC2, the third gain control signal VC3, and the fourth gain control signal VC4. The control signal generation circuit 140 may generate the first to fourth gain control signals VC1 to VC4 based on gain adjustment information EQ. The gain adjustment information EQ may indicate a signal which may be randomly generated depending on the characteristics and operation environment of a semiconductor apparatus including the amplifier 100. The control signal generation circuit 140 may generate the first to fourth gain control signals VC1 to VC4 having a plurality of bits or voltage levels suitable for controlling the first to fourth gain adjusting circuits 112, 122, 123, and 132. The control signal generation circuit 140 may generate the first to fourth gain control signals VC1 to VC4 as bias voltages having different voltage levels, based on the gain adjustment information EQ.

Figure 2A:
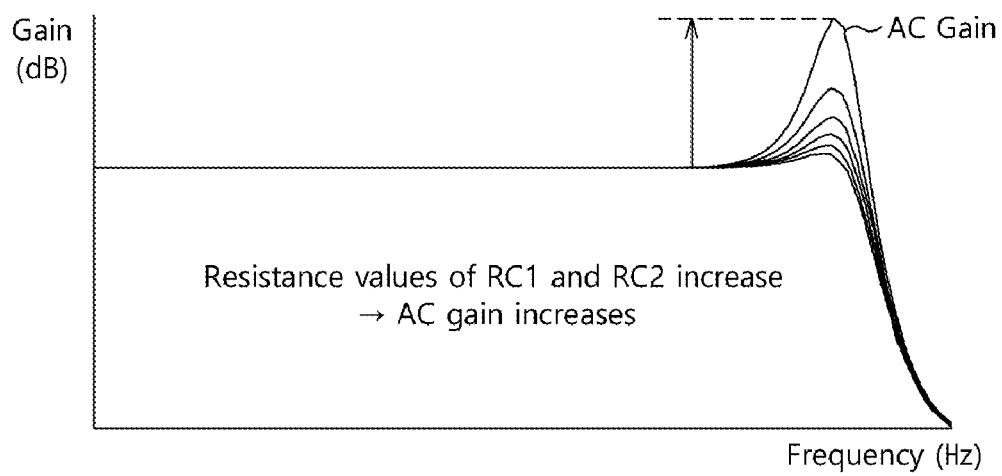
FIGS. 2A, 2B, 2C, 3A, and 3B are graphs illustrating gains of an amplifier in accordance with the present embodiment.
Figure 2B:
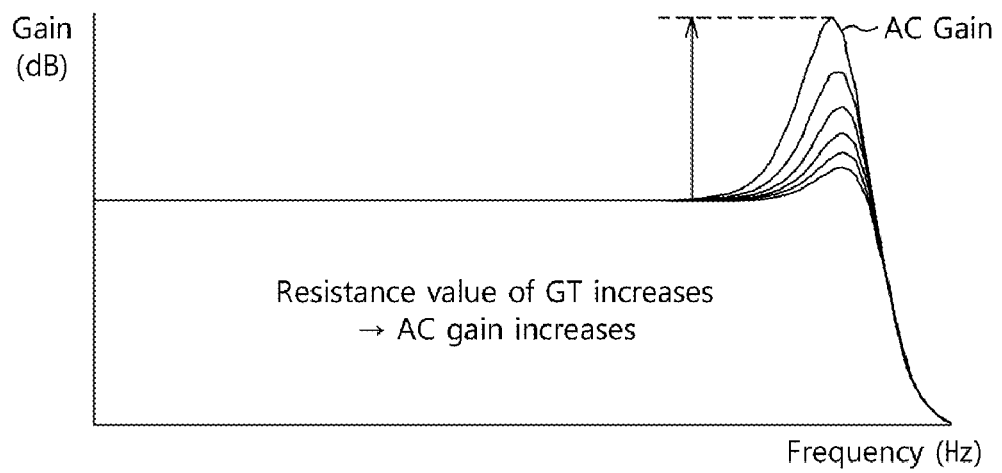
Figure 2C:
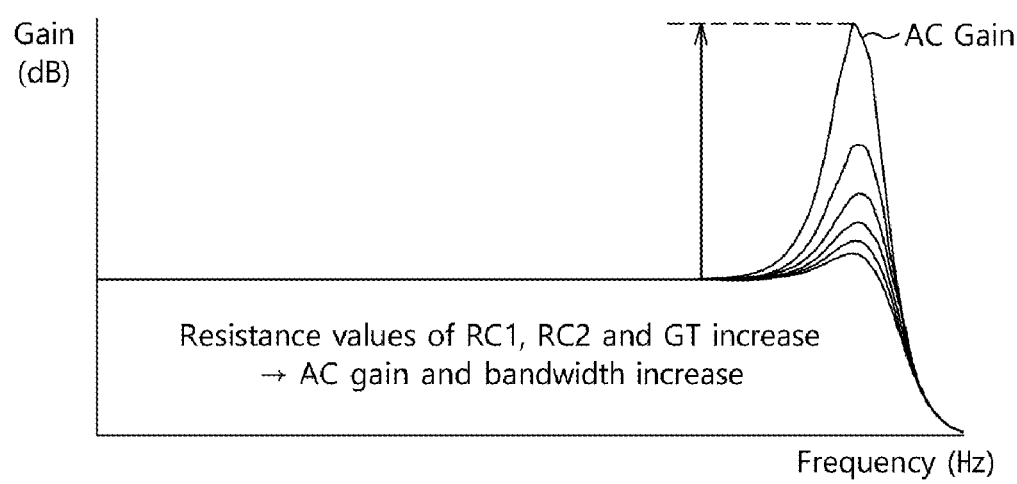

FIGS. 2A to 2C and 3A to 3B are graphs illustrating gains of the amplifier 100 in accordance with some embodiments. FIG. 2A illustrates a gain change of the amplifier 100 according to an operation of the first gain adjusting circuit 112, FIG. 2B illustrates a gain change of the amplifier 100 according to an operation of the fourth gain adjusting circuit 132, and FIG. 2C illustrates a gain change of the amplifier 100 according to the operations of the first and fourth gain adjusting circuits 112 and 132. In the graphs of FIGS. 2A to 2C, the x-axis may correspond to the frequency of the input signal IN/INB, and the y-axis may correspond to the gain of the amplifier 100. The frequency of the input signal IN/INB may be expressed in units of hertz (Hz), and the gain of the amplifier 100 may be expressed in units of decibels (dB). Referring to FIG. 1 as well as FIGS. 2A to 2C, when the voltage levels of the first and second amplification nodes AN1 and AN2 are changed, the amounts of current supplied to the first and second amplification nodes AN1 and AN2 from the first supply voltage VH terminal may be changed by the first and third transistors T1 and T3. When the voltage level of the first gain control signal VC1 is decreased to increase the resistance values of the first and second resistor circuits RC1 and RC2, a peak of the first amplified signal AOUT and a peak of the output signal OUT may occur in the case that the voltage level of the first input signal IN transitions. The first gain adjusting circuit 112 may cause the peak of the output signal OUT, thereby increasing the AC gain of the amplifier 100 as illustrated in FIG. 2A. For example, as the resistance values of the first and second resistor circuits RC1 and RC2 are increased, the AC gain of the amplifier 100 may be increased. On the other hand, as the resistance values of the first and second resistor circuits RC1 and RC2 are decreased, the AC gain of the amplifier 100 may be decreased. Therefore, when the voltage level of the first gain control signal VC1 inputted to the first and second resistor circuits RC1 and RC2 is decreased, the resistance values of the second and fourth transistors T2 and T4 may be increased, and the AC gain of the amplifier 100 may be increased. On the other hand, when the voltage level of the first gain control signal VC1 inputted to the first and second resistor circuits RC1 and RC2 is increased, the resistance values of the second and fourth transistors T2 and T4 may be increased, and the AC gain of the amplifier 100 may be decreased.

Referring to FIG. 2B, the fourth gain adjusting circuit 132 may adjust the AC gain of the amplifier 100. For example, as the resistance value of the fourth gain adjusting circuit 132 is increased, the AC gain of the amplifier 100 may be increased. On the other hand, as the resistance value of the fourth gain adjusting circuit 132 is decreased, the AC gain of the amplifier 100 may be decreased. Therefore, when the voltage level of the fourth gain control signal VC4 inputted to the fourth gain adjusting circuit 132 is increased, the resistance value of the gain transistor GT may be increased, and the AC gain of the amplifier 100 may be increased. On the other hand, when the voltage level of the fourth gain control signal VC4 inputted to the fourth gain adjusting circuit 132 is decreased, the resistance value of the gain transistor GT may be decreased, and the AC gain of the amplifier 100 may be decreased.

Referring to FIG. 2C, when the resistance value of the gain transistor GT of the fourth gain adjusting circuit 132 is increased while the resistance values of the first and second resistor circuits RC1 and RC2 of the first gain adjusting circuit 112 are increased, the AC gain and bandwidth of the amplifier 100 may be further increased. The bandwidth may indicate a range of frequencies at which a predetermined level of gain can be obtained. When the voltage level of the first gain control signal VC1 is decreased and the voltage level of the fourth gain control signal VC4 is increased, the AC gain of the amplifier 100 may be increased in a specific frequency region, and the specific frequency region in which the AC gain is increased may be expanded. Therefore, by adjusting the voltage levels of the first and fourth gain control signals VC1 and VC4 according to the environment of a signal bus and/or channel to which the input signal IN is transmitted, it is possible to control the gain and bandwidth of the amplifier 100 such that the amplifier 100 can have the optimal AC gain and bandwidth. Therefore, it is possible to increase the amplitude and valid duration of the output signal OUT generated by amplifying the first and second input signals IN and INB.

Figure 3A:
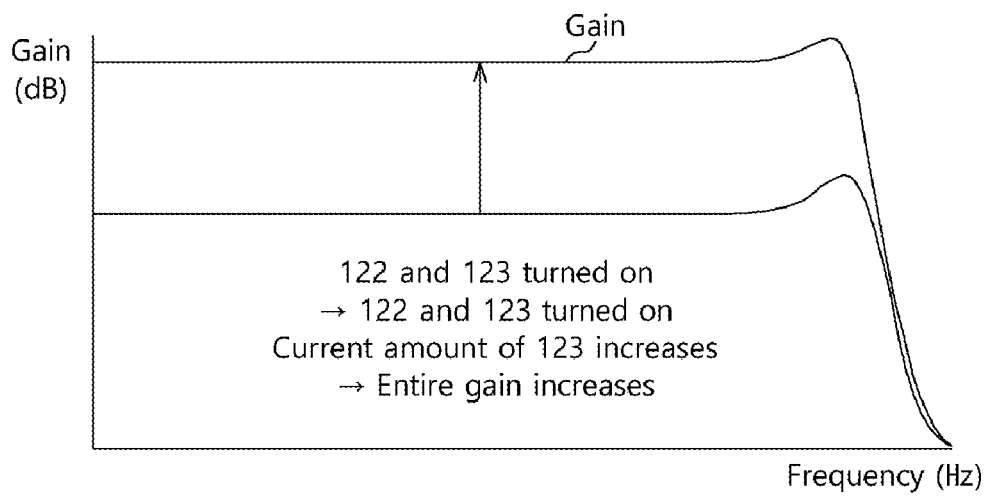
Figure 3B:
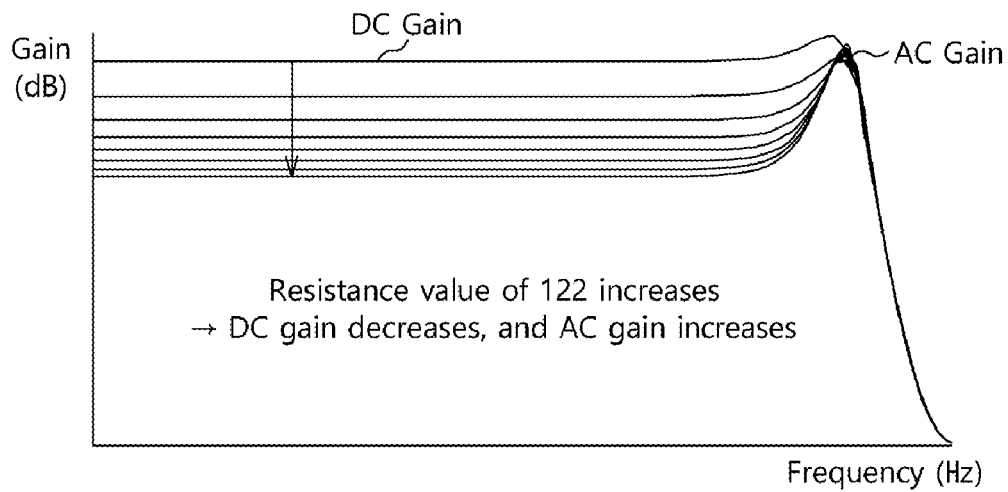

FIGS. 3A and 3B are graphs illustrating gain changes of the amplifier 100 according to operations of the second and third gain adjusting circuits 122 and 123. Referring to FIG. 3A, when the second gain adjusting circuit 122 is turned on based on the second gain control signal VC2 and couples the first and second equalization nodes QN1 and QN2 and the third gain adjusting circuit 123 is turned on based on the third gain control signal VC3 and passes a current through the first and second equalization nodes QN1 and QN2, the entire gain of the amplifier 100, i.e. the AC gain and the DC gain, may be increased. For example, as the amounts of current flowing through the first and second equalization nodes QN1 and QN2 are increased by the third gain adjusting circuit 123, the entire gain of the amplifier 100 may be increased.

Referring to FIG. 3B, when the third gain adjusting circuit 123 adjusts the amounts of current flowing through the first and second equalization nodes QN1 and QN2 while the second gain adjusting circuit 122 does not couple the first and second equalization nodes QN1 and QN2, the AC gain of the amplifier 100 may be changed. For example, as the amounts of current flowing through the first and second equalization nodes QN1 and QN2 are increased by the third gain adjusting circuit 123, the AC gain of the amplifier 100 may be increased. At this time, according to the resistance value of the second gain adjusting circuit 122, the DC gain of the amplifier 100 may be changed. As the resistance value of the second gain adjusting circuit 122 is increased, the DC gain of the amplifier 100 may be decreased. On the other hand, as the resistance value of the second gain adjusting circuit 122 is decreased, the DC gain of the amplifier 100 may be increased. When the resistance value of the second gain adjusting circuit 122 is increased and the amounts of current flowing through the first and second equalization nodes QN1 and QN2 are increased by the third gain adjusting circuit 123, the DC gain of the amplifier 100 may be decreased, and the AC gain of the amplifier 100 may be increased. When the DC gain of the amplifier 100 is decreased, the AC gain of the amplifier 100 may be further increased.

Figure 4:
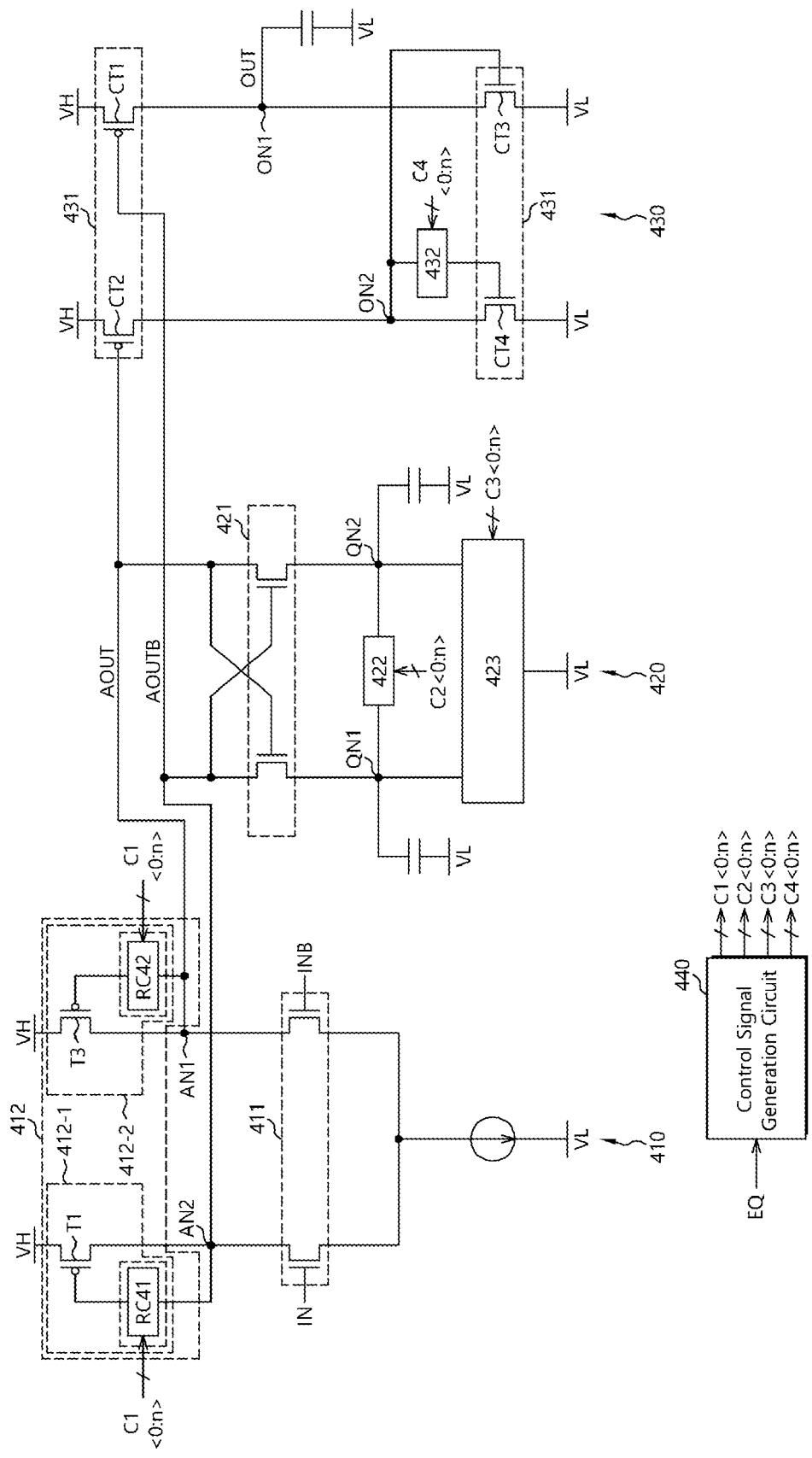
FIG. 4 is a diagram illustrating a configuration of an amplifier in accordance with an embodiment.

FIG. 4 illustrates a configuration of an amplifier 400 in accordance with an embodiment. In FIG. 4, the amplifier 400 may include an amplification stage 410, an equalization stage 420, and an output stage 430. The amplification stage 410 may include an amplification circuit 411 and a first gain adjusting circuit 412. The amplification circuit 411 may generate first and second amplified signals AOUT and AOUTB through first and second amplification nodes AN1 and AN2 based on input signals IN and INB. The first gain adjusting circuit 412 may include a first active inductor 412-1 and a second active inductor 412-2. The first active inductor 412-1 may include a first transistor T1 and a first resistor circuit RC41. The second active inductor 412-2 may include a third transistor T3 and a second resistor circuit RC42. The equalization stage 420 may include an equalization circuit 421, a second gain adjusting circuit 422, and a third gain adjusting circuit 423. The equalization circuit 421 may be coupled between the first and second amplification nodes AN1 and AN2 and the first and second equalization nodes QN1 and QN2. The output stage 430 may include an output circuit 431 and a fourth gain adjusting circuit 432. The output circuit 431 may generate an output signal OUT by changing the voltage levels of the first and second output nodes ON1 and ON2 based on the voltage levels of the first and second amplification nodes AN1 and AN2. The output circuit 431 may include a first current transistor CT1, a second current transistor CT2, a third current transistor CT3, and a fourth current transistor CT4. The amplifier 400 may further include a control signal generation circuit 440. The control signal generation circuit 440 may generate the first to fourth gain control signals C1<0:n> to C4<0:n> as digital code signals having different code values based on gain adjustment information EQ, where n is an integer equal to or greater than two. The amplifier 400 may have the same configuration as the amplifier 100 illustrated in FIG. 1, except the first resistor circuit RC41, the second resistor circuit RC42, the second gain adjusting circuit 422, the third gain adjusting circuit 423, and the fourth gain adjusting circuit 432. Components that perform the same functions may be represented by the same or similar reference numerals, and duplicated descriptions of same or similar components are omitted herein. Each of the first and second resistor circuits RC41 and RC42 may include a plurality of transistors, and have a resistance value that is adjusted based on the first gain control signal C1<0:n> having a plurality of bits. The second gain adjusting circuit 422 may include a plurality of transistors, and have a resistance value that is adjusted based on the second gain control signal C2<0:n> having a plurality of bits. The third gain adjusting circuit 423 may include a plurality of transistors, and change the amounts of current flowing through the first and second equalization nodes QN1 and QN2, based on the third gain control signal C3<0:n> having a plurality of bits. The fourth gain adjusting circuit 432 may include a plurality of transistors, and have a resistance value that is adjusted based on the fourth gain control signal C4<0:n> having a plurality of bits.

Figure 5:
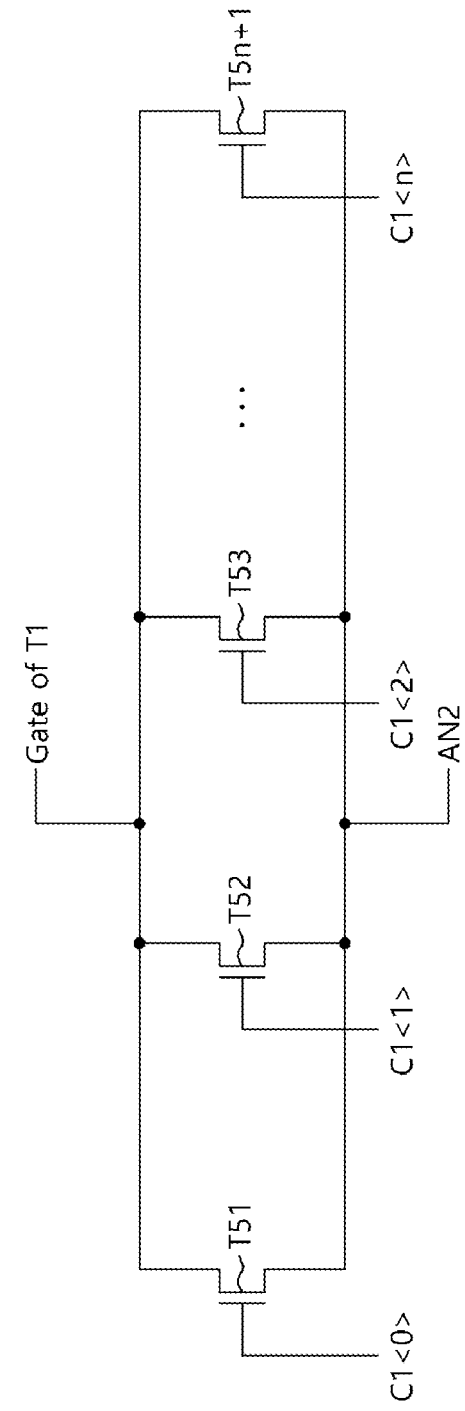
FIG. 5 is a diagram illustrating a configuration of a first resistor circuit illustrated in FIG. 4.

FIG. 5 illustrates the configuration of the first resistor circuit RC41 illustrated in FIG. 4. In FIG. 5, the first resistor circuit RC41 may include first to (n+1)th transistors T51 to T5n+1. The first to (n+1)th transistors T51 to T5n+1 may be N-channel MOS transistors. The number of the transistors included in the first resistor circuit RC41 may correspond to the number of bits included in the first gain control signal C1<0:n>. Drains of the first to (n+1)th transistors T51 to T5n+1 may be coupled to a gate of the first transistor T1 in common. Sources of the first to (n+1)th transistors T51 to T5n+1 may be coupled to the second amplification node AN2 in common. The first to (n+1)th transistors T51 to T5n+1 may receive first to nth bits of the first gain control signal C1<0:n>, respectively. Each of the first to (n+1)th transistors T51 to T5n+1 may be turned on based on an allocated bit of the first gain control signal C1<0:n>. The first to (n+1)th transistors T51 to T5n+1 may have different sizes. For example, the size may indicate the ratio of width to length of the gate of the transistor. For example, the first transistor T51 may have the smallest size, and the (n+1)th transistor T5n+1 may have the largest size. For example, the size of the second transistor T52 may be twice as large as the size of the first transistor T51, and the size of the third transistor T53 may be four times as large as the size of the first transistor T51. The size of the (n+1)th transistor T5n+1 may be $2^n$ times larger than the size of the first transistor T51. When the first to (n+1)th transistors T51 to T5n+1 have different sizes, the first to (n+1)th transistors T51 to T5n+1 may have different turn-on resistance values. When the number and types of transistors turned on by the first gain control signal C1<0:1> are changed, the first resistor circuit RC41 may be set to various resistance values. The second resistor circuit RC42 may have the same configuration as the first resistor circuit RC41 except that the drains of the first to (n+1)th transistors are coupled to the gate of the third transistor T3 in common and the sources of the first to (n+1)th transistors are coupled to the first amplification node AN1 in common.

Figure 6:
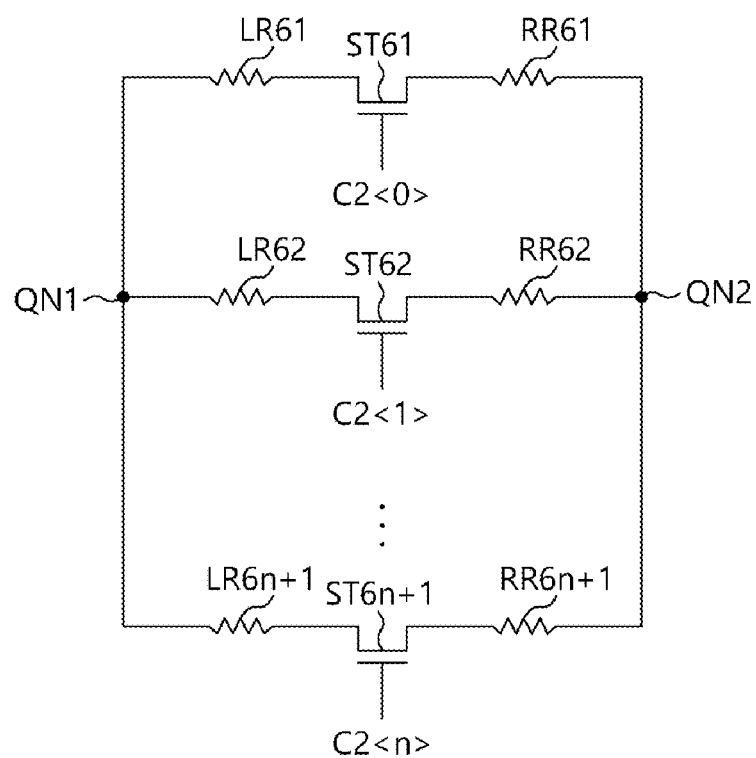
FIG. 6 is a diagram illustrating a configuration of a second gain adjusting circuit illustrated in FIG. 4.

FIG. 6 illustrates a configuration of the second gain adjusting circuit 422 illustrated in FIG. 4. The second gain adjusting circuit 422 may include first to (n+1)th left resistors LR61 to LR6n+1, first to (n+1)th right resistors RR61 to RR6n+1, and first to (n+1)th source transistors ST61 to ST6n+1. The first to (n+1)th left resistors LR61 to LR6n+1 may each have one end coupled to the first equalization node QN1 in common. The first to (n+1)th right resistors RR61 to RR6n+1 may each have one end coupled to the second equalization node QN2 in common. The first source transistor ST61 may be coupled to the other ends of the first left resistor LR61 and the first right resistor RR61, and couple the first left resistor LR61 and the first right resistor RR61 based on a first bit C2<0> of the second gain control signal. The second source transistor ST62 may be coupled to the other ends of the second left resistor LR62 and the second right resistor RR62, and couple the second left resistor LR62 and the second right resistor RR62 based on a second bit C2<1> of the second gain control signal. The (n+1)th source transistor ST6n+1 may be coupled to the other ends of the (n+1)th left resistor LR6n+1 and the (n+1)th right resistor RR6n+1, and couple the (n+1)th left resistor LR6n+1 and the (n+1)th right resistor RR6n+1 based on an (n+1)th bit C2<n> of the second gain control signal. The first left resistor LR61 and the first right resistor RR61 may have the same resistance value, and the first left resistor LR61 and the first right resistor RR61 may have the largest resistance value. The (n+1)th left resistor LR6n+1 and the (n+1)th right resistor RR6n+1 may have the same resistance value, and the (n+1)th left resistor LR6n+1 and the (n+1)th right resistor RR6n+1 may have the smallest resistance value. For example, the resistance values of the second left resistor LR62 and the second right resistor RR62 may be $2^{n-1}$ times larger than the resistance values of the (n+1)th left resistor LR6n+1 and the (n+1)th right resistor RR6n+1. The resistance values of the first left resistor LR61 and the first right resistor RR61 may be $2^n$ times larger than the resistance values of the (n+1)th left resistor LR6n+1 and the (n+1)th right resistor RR6n+1. When the number of source transistors turned on by the second gain control signal C2<0:n> is changed, the second gain adjusting circuit may be set to have various resistance values.

Figure 7:
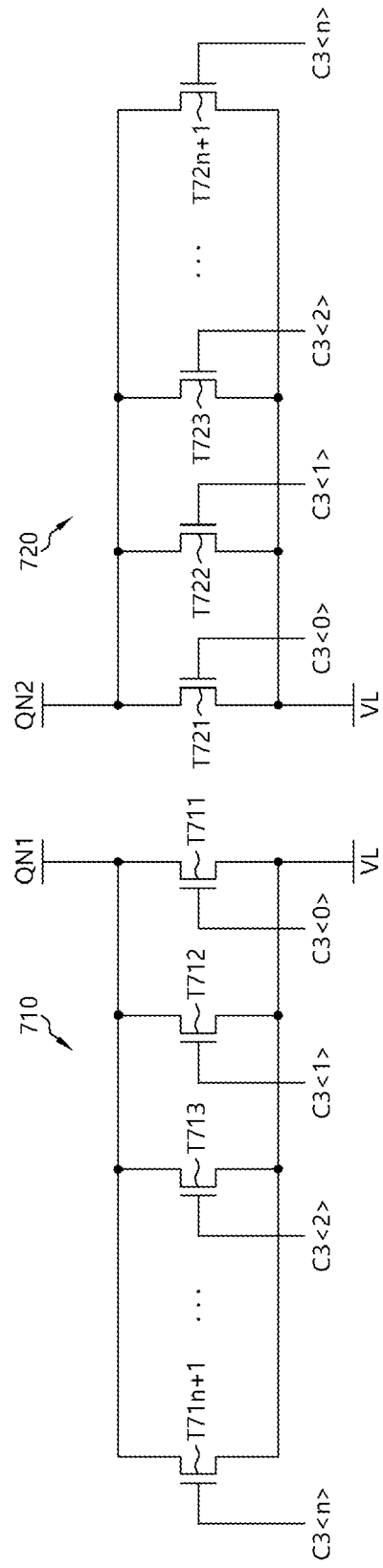
FIG. 7 is a diagram illustrating a configuration of a third gain adjusting circuit illustrated in FIG. 4.

FIG. 7 is a diagram illustrating a configuration of the third gain adjusting circuit 423 illustrated in FIG. 4. In FIG. 7, the third gain adjusting circuit 423 may include a first variable current source 710 and a second variable current source 720. The first variable current source 710 may include first to (n+1)th transistors T711 to T71n+1, and the second variable current source 720 may include first to (n+1)th transistors T721 to T72n+1. The first to (n+1)th transistors T711 to T71n+1 and T721 to T72n+1 of the first and second variable current sources 710 and 720 may be N-channel MOS transistors. Drains of the first to (n+1)th transistors T711 to T71n+1 may be coupled to the first equalization node QN1 in common, and sources of the first to (n+1)th transistors T711 to T71n+1 may be coupled to the second supply voltage VL terminal in common. Drains of the first to (n+1)th transistors T721 to T72n+1 may be coupled to the second equalization node QN2 in common, and sources of the first to (n+1)th transistors T721 to T72n+1 may be coupled to the second supply voltage VL terminal in common. The first transistors T711 and T721 may receive a first bit C3<0> of the third gain control signal, and the second transistors T712 and T722 may receive a second bit C3<1> of the third gain control signal. The third transistors T713 and T723 may receive a third bit C3<2> of the third gain control signal. The (n+1)th transistors T71n+1 and T72n+1 may receive an (n+1)th bit C3<n> of the third gain control signal. The first transistors T711 and T721 may have the smallest size, and the (n+1)th transistors T71n+1 and T72n+1 may have the largest size. The size of the second transistors T712 and T722 may be twice as large as the size of the first transistors T711 and T721. The size of the third transistors T713 and T723 may be four times as large as the size of the first transistors T711 and T721. The size of the (n+1)th transistors T71n+1 and T72n+1 may be $2^n$ times as large as the size of the first transistors T711 and T721. Because the first to (n+1)th transistors T711 to T71n+1 and T721 to T72n+1 have different sizes, the first to (n+1)th transistors T711 to T71n+1 and T721 to T72n+1 may have different current drivabilities. The third gain control signal C3<0:n> may change the number of transistors to be turned on, thereby changing the amounts of current applied from the first and second equalization nodes QN1 and QN2 to the second supply voltage VL terminal by the first and second variable current sources 710 and 720 in various manners.

Figure 8:
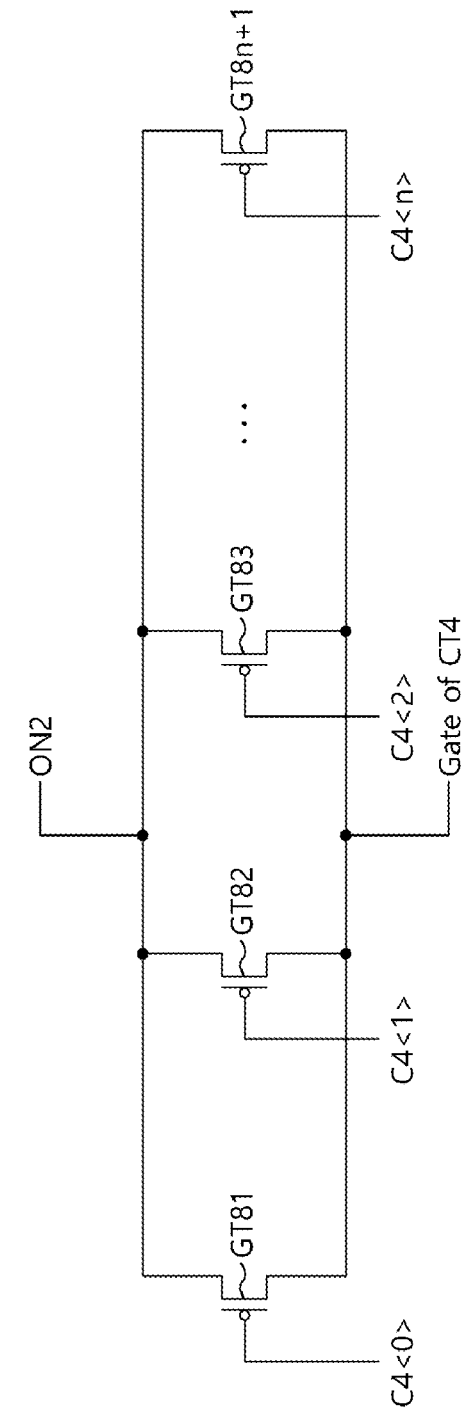
FIG. 8 is a diagram illustrating a configuration of a fourth gain adjusting circuit illustrated in FIG. 4.

FIG. 8 is a diagram illustrating a configuration of the fourth gain adjusting circuit 432 illustrated in FIG. 4. In FIG. 8, the fourth gain adjusting circuit 432 may include first to (n+1)th gain transistors GT81 to GT8n+1. The first to (n+1)th gain transistors GT81 to GT8n+1 may be P-channel MOS transistors. Sources of the first to (n+1)th gain transistors GT81 to GT8n+1 may be coupled to the second output node ON2 in common. Drains of the first to (n+1)th gain transistors GT81 to GT8n+1 may be coupled to the gate of the fourth current transistor CT4 in common. The first to (n+1)th gain transistors GT81 to GT8n+1 may receive the first to nth bits C4<0:n> of the fourth gain control signal, respectively. Each of the first to (n+1)th gain transistors GT81 to GT8n+1 may be turned on based on an allocated bit of the fourth gain control signal. The first to (n+1)th gain transistors GT81 to GT8n+1 may have different sizes. For example, the first gain transistor GT81 may have the smallest size, and the (n+1)th gain transistor GT8n+1 may have the largest size. For example, the size of the second gain transistor GT82 may be twice as large as the size of the first gain transistor GT81, and the size of the third gain transistor GT83 may be four times as large as the size of the first gain transistor GT81. The size of the (n+1)th gain transistor GT8n+1 may be $2^n$ times as large as the size of the first gain transistor GT81. When the first to (n+1)th gain transistors GT81 to GT8n+1 have different sizes, the first to (n+1)th gain transistors GT81 to GT8n+1 may have different turn-on resistance values. The fourth gain control signal C4<0:n> may change the number and types of transistors to be turned on, and thus control the fourth gain adjusting circuit 432 to have various resistance values.

Figure 9:
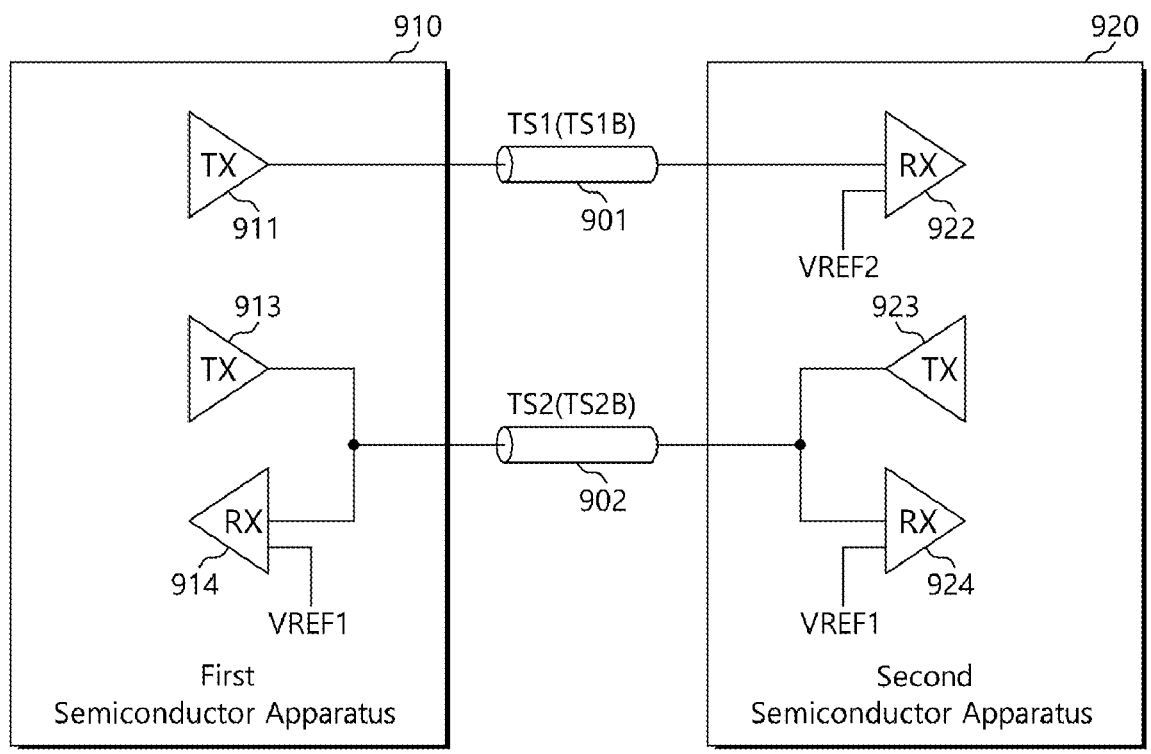
FIG. 9 is a diagram illustrating a configuration of a semiconductor system in accordance with an embodiment.

FIG. 9 illustrates a configuration of a semiconductor system 900 in accordance with an embodiment. In FIG. 9, the semiconductor system 900 may include a first semiconductor apparatus 910 and a second semiconductor apparatus 920. The first semiconductor apparatus 910 may provide various control signals required for operating the second semiconductor apparatus 920. The first semiconductor apparatus 910 may include various types of host devices. For example, the first semiconductor apparatus 910 may be a host device such as a central processing unit (CPU), graphic processing unit (GPU), multi-media processor (MMP), digital signal processor, application processor (AP), or memory controller. The second semiconductor apparatus 920 may be a memory device, for example, and the memory device may include a volatile memory and a nonvolatile memory. The volatile memory may include an SRAM (Static RAM), DRAM (Dynamic RAM), and SDRAM (Synchronous DRAM), and the nonvolatile memory may include a ROM (Read Only Memory), PROM (Programmable ROM), EEPROM (Electrically Erasable and Programmable ROM), EPROM (Electrically Programmable ROM), flash memory, PRAM (Phase change RAM), MRAM (Magnetic RAM), RRAM (Resistive RAM), FRAM (Ferroelectric RAM), and the like.

The second semiconductor apparatus 920 may be coupled to the first semiconductor apparatus 910 through first and second buses 901 and 902. The first and second buses 901 and 902 may be signal transmission paths, links or channels for transmitting signals. The first bus 901 may be a unidirectional bus. The first semiconductor apparatus 910 may transmit a first signal TS1 to the second semiconductor apparatus 920 through the first bus 901, and the second semiconductor apparatus 920 may be coupled to the first bus 901 to receive the first signal TS1 transmitted from the first semiconductor apparatus 910. The first signal TS1 may include control signals such as a command signal, a clock signal, and address signal, for example. The second bus 902 may include a bidirectional bus. The first semiconductor apparatus 910 may transmit a second signal TS2 to the second semiconductor apparatus 920 through the second bus 902, or receive the second signal TS2 transmitted from the second semiconductor apparatus 920 through the second bus 902. The second semiconductor apparatus 920 may transmit the second signal TS2 to the first semiconductor apparatus 910 through the second bus 902, or receive the second signal TS2 transmitted from the first semiconductor apparatus 910 through the second bus 902. The second signal TS2 may include data, for example. In an embodiment, the first and second signals TS1 and TS2 may be transmitted as a differential signal pair with complementary signals TS1B and TS2B through the first and second buses 901 and 902, respectively. In an embodiment, the first and second signals TS1 and TS2 may be transmitted as single-ended signals through the first and second buses 901 and 902, respectively.

The first semiconductor apparatus 910 may include a first transmitting (TX) circuit 911, a second transmitting circuit 913, and a receiving (RX) circuit 914. The first transmitting circuit 911 may be coupled to the first bus 901, and drive the first bus 901 to transmit the first signal TS1 to the second semiconductor apparatus 920, based on an internal signal of the first semiconductor apparatus 910. The second transmitting circuit 913 may be coupled to the second bus 902, and drive the second bus 902 to transmit the second signal TS2 to the second semiconductor apparatus 920, based on the internal signal of the first semiconductor apparatus 910. The receiving circuit 914 may be coupled to the second bus 902, and receive the second signal TS2 transmitted from the second semiconductor apparatus 920 through the second bus 902. The receiving circuit 914 may generate the internal signal used in the first semiconductor apparatus 910 by differentially amplifying the second signal TS2 transmitted through the second bus 902. When a differential signal pair is transmitted through the second bus 902, the receiving circuit 914 may generate the internal signal by differentially amplifying the second signal TS2 and a complementary signal TS2B of the second signal. When a single-ended signal is transmitted through the second bus 902, the receiving circuit 914 may generate the internal signal by differentially amplifying the second signal TS2 and a first reference voltage VREF1. The first reference voltage VREF1 may have a voltage level corresponding to the middle of the range in which the second signal TS2 swings. The receiving circuit 914 may include any one of the amplifiers 100 and 400 illustrated in FIGS. 1 and 4.

The second semiconductor apparatus 920 may include a first receiving (RX) circuit 922, a transmitting (TX) circuit 923, and a second receiving circuit 924. The first receiving circuit 922 may be coupled to the first bus 901, and receive the first signal TS1 transmitted from the first semiconductor apparatus 910 through the first bus 901. The first receiving circuit 922 may generate an internal signal used in the second semiconductor apparatus 920 by differentially amplifying the first signal TS1 transmitted through the first bus 901. When a differential signal pair is transmitted through the first bus 901, the first receiving circuit 922 may generate the internal signal by differentially amplifying the first signal TS1 and a complementary signal TS1B of the first signal. When a single-ended signal is transmitted through the first bus 901, the first receiving circuit 922 may generate the internal signal by differentially amplifying the first signal TS1 and a second reference voltage VREF2. The second reference voltage VREF2 may have a voltage level corresponding to the middle of the range in which the first signal TS1 swings. The transmitting circuit 923 may be coupled to the second bus 902, and drive the second bus 902 to transmit the second signal TS2 to the first semiconductor apparatus 910, based on the internal signal of the second semiconductor apparatus 920. The second receiving circuit 924 may be coupled to the second bus 902, and receive the second signal TS2 transmitted from the first semiconductor apparatus 910 through the second bus 902. The second receiving circuit 924 may generate the internal signal used in the second semiconductor apparatus 920 by differentially amplifying the second signal TS2 transmitted through the second bus 902. When a differential signal pair is transmitted through the second bus 902, the second receiving circuit 924 may generate the internal signal by differentially amplifying the second signal TS2 and the complementary signal TS2B of the second signal. When a single-ended signal is transmitted through the second bus 902, the second receiving circuit 924 may generate the internal signal by differentially amplifying the second signal TS2 and the first reference voltage VREF1. The first and second receiving circuits 922 and 924 may include any one of the amplifiers 100 and 400 illustrated in FIGS. 1 and 4.

Figure 10:
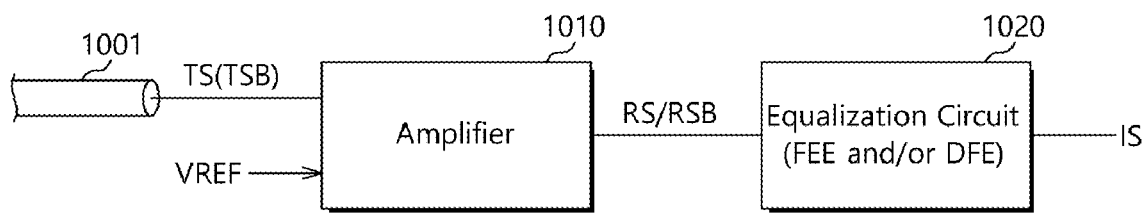
FIG. 10 is a diagram illustrating a configuration of a receiving circuit in accordance with an embodiment.

FIG. 10 illustrates a configuration of a receiving circuit 1000 in accordance with an embodiment. The receiving circuit 1000 may be coupled to an external bus 1001 or a channel, and receive a transmit (Tx) signal TS transmitted through the external bus 1001. The receiving circuit 1000 may generate an internal signal IS from the Tx signal TS. Inter-symbol interference (ISI) may occur in the Tx signal TS due to a high frequency loss, reflection, or cross-talk of the external bus 1001 or the channel. Thus, a previously transmitted signal may cause precursor interference with a signal to be subsequently transmitted. The receiving circuit 1000 may include an amplifier 1010 and an equalization circuit 1020 in order to reduce or minimize the precursor interference.

The amplifier 1010 may be coupled to the external bus 1001, and receive a Tx signal TS transmitted through the external bus 1001. The amplifier 1010 may generate a pair of receive (Rx) signals RS and RSB by differentially amplifying the Tx signal TS. The Rx signal pair may include the Rx signal RS and a complementary signal RSB of the Rx signal. The amplifier 1010 may accurately amplify a level transition of the Tx signal TS by increasing an AC gain instead of decreasing a DC gain, in order to generate the Rx signal RS. The Tx signal TS may be transmitted as a differential signal pair with the complementary signal TSB, and transmitted as a single-ended signal. The amplifier 1010 may generate the Rx signal RS by differentially amplifying the Tx signal TS and the complementary signal TSB, and generate the Rx signal RS by differentially amplifying the Tx signal TS transmitted as the single-ended signal and the reference voltage VREF. The amplifier 1010 may be a CTLE (Continuous Time Linear Equalizer), and the amplifiers 100 and 400 illustrated in FIGS. 1 and 4 may be applied as the amplifier 1010.

The equalization circuit 1020 may receive the Rx signal pair RS and RSB, and generate the internal signal IS. The equalization circuit 1020 may generate the internal signal IS by removing a precursor which may occur in the Rx signal pair RS and RSB. The equalization circuit 1020 may be implemented in various manners depending on the characteristics of a semiconductor apparatus to which the receiving circuit 1000 is applied. The equalization circuit 1020 may include one or more of a decision feedback equalization circuit and a feed forward equalization circuit.

While various embodiments have been described above, it will be understood by those skilled in the art that the described embodiments represent only a limited number of possible embodiments. Accordingly, the amplifier of the present teaching should not be limited based on the described embodiments.

What is claimed is:

1. An amplifier comprising:
    an amplification circuit configured to change voltage levels of a first amplification node and a second amplification node based on a first input signal and a second input signal;
    an equalization circuit configured to couple a first equalization node to the second amplification node based on the voltage level of the first amplification node and configured to couple a second equalization node to the first amplification node based on the voltage level of the second amplification node;
    a first gain adjusting circuit configured to couple the first and second equalization nodes based on a first gain control signal; and
    a second gain adjusting circuit configured to change amounts of current flowing through the first and second equalization nodes based on a second gain control signal,
    wherein the first gain adjusting circuit comprises a first resistor having one end coupled to the first equalization node, a second resistor having one end coupled to the second equalization node, and a source transistor configured to receive the first gain control signal to couple the other ends of the first and second resistors.

2. The amplifier according to claim 1, wherein the equalization circuit comprises:
    a first equalization transistor configured to couple the second amplification node to the first equalization node based on the voltage level of the first amplification node; and
    a second equalization transistor configured to couple the first amplification node to the second equalization node based on the voltage level of the second amplification node.

3. The amplifier according to claim 1, wherein the second gain adjusting circuit comprises:
    a first current source coupled between the first equalization node and a second supply voltage terminal, and having a current amount that is varied by the second gain control signal; and
    a second current source coupled between the second equalization node and the second supply voltage terminal, and having a current amount that is varied by the second gain control signal.

4. The amplifier according to claim 1, further comprising a third gain adjusting circuit including active inductors configured to change voltage levels applied to the first and second amplification nodes based on the voltage levels of the first and second amplification nodes and a third gain control signal.

5. The amplifier according to claim 4, wherein the third gain adjusting circuit comprises:
    a first active inductor coupled between a first supply voltage terminal and the second amplification node, and configured to adjust the voltage level applied to the second amplification node based on the first gain control signal; and
    a second active inductor coupled between the first supply voltage terminal and the first amplification node, and configured to adjust the voltage level applied to the first amplification node based on the first gain control signal.

6. The amplifier according to claim 5, wherein the first active inductor comprises:

a first transistor having a source coupled to the first supply voltage terminal and a drain coupled to the second amplification node; and a first resistor circuit coupled between a gate of the first transistor and the second amplification node, and having a resistance value which is changed based on the first gain control signal.

7. The amplifier according to claim 5, wherein the second active inductor comprises:

a second transistor having a source coupled to the first supply voltage terminal and a drain coupled to the first amplification node; and a second resistor circuit coupled between a gate of the second transistor and the first amplification node, and having a resistance value which is changed based on the first gain control signal.

8. The amplifier according to claim 1, further comprising:

an output circuit configured to generate an output signal based on the voltage levels of the first and second amplification nodes; and a fourth gain adjusting circuit configured to change a voltage level of the output signal based on a fourth gain control signal.

9. An amplifier comprising:

an amplification circuit configured to change voltage levels of a first amplification node and a second amplification node based on a first input signal and a second input signal;

a first transistor having a source coupled to a first supply voltage terminal and a drain coupled to the second amplification node;

a first resistor circuit coupled between a gate of the first transistor and the second amplification node, and having a resistance value which is changed based on a first gain control signal a second transistor having a source coupled to the first supply voltage terminal and a drain coupled to the first amplification node;

a second resistor circuit coupled between a gate of the third transistor and the first amplification node, and having a resistance value which is changed based on the first gain control signal an equalization circuit configured to change the voltage level of the second amplification node based on the voltage level of the first amplification node and configured to change the voltage level of the first amplification node based on the voltage level of the second amplification node; and an output circuit configured to generate an output signal based on the voltage levels of the first and second amplification nodes.

* * * * *